(12) United States Patent
Ikeda

(10) Patent No.: US 9,775,237 B2
(45) Date of Patent: Sep. 26, 2017

(54) WIRING SUBSTRATE AND METHOD FOR MANUFACTURING THE SAME

(71) Applicant: IBIDEN CO., LTD., Ogaki (JP)

(72) Inventor: Kosuke Ikeda, Ogaki (JP)

(73) Assignee: IBIDEN CO., LTD., Ogaki (JP)

(*) Notice: Subject to any disclaimer, the term of this patent is extended or adjusted under 35 U.S.C. 154(b) by 0 days.

(21) Appl. No.: 15/153,884

(22) Filed: May 13, 2016

(65) Prior Publication Data
US 2016/0338195 A1 Nov. 17, 2016

(30) Foreign Application Priority Data
May 15, 2015 (JP) .................................. 2015-099629

(51) Int. Cl.
| | | |
|---|---|---|
| H05K 1/09 | (2006.01) | |
| H05K 1/02 | (2006.01) | |
| H05K 1/11 | (2006.01) | |
| H05K 1/03 | (2006.01) | |
| H05K 3/46 | (2006.01) | |
| H05K 3/40 | (2006.01) | |

(52) U.S. Cl.
CPC ......... *H05K 1/0298* (2013.01); *H05K 1/0373* (2013.01); *H05K 1/115* (2013.01); *H05K 3/4038* (2013.01); *H05K 3/4652* (2013.01); *H05K 2201/0183* (2013.01); *H05K 2201/10416* (2013.01)

(58) Field of Classification Search
CPC .. H05K 1/00; H05K 1/02; H05K 1/05; H05K 1/114; H05K 1/115; H05K 1/185; H05K 1/231; H05K 1/298; H05K 3/46; H05K 3/4608; H05K 3/4644; H05K 3/4673; H01L 23/145; H01L 23/495; H01L 23/4608
USPC ........ 174/251, 250, 255, 258, 262; 428/209, 428/306.6; 257/668, 774; 361/767
See application file for complete search history.

(56) References Cited

U.S. PATENT DOCUMENTS

| | | | | |
|---|---|---|---|---|
| 6,869,665 | B2 * | 3/2005 | Tani ....................... | H05K 1/056 |
| | | | | 174/250 |
| 7,294,393 | B2 * | 11/2007 | Murai ...................... | B32B 7/12 |
| | | | | 174/258 |

(Continued)

FOREIGN PATENT DOCUMENTS

JP 2001-345560 A 12/2001

*Primary Examiner* — Xiaoliang Chen
(74) *Attorney, Agent, or Firm* — Oblon, McClelland, Maier & Neustadt, L.L.P.

(57) ABSTRACT

A wiring substrate includes a core substrate, and a build-up layer including conductor layers and insulating layers alternately laminated on the substrate and via conductors formed in the insulating layers, each insulating layer having a coating layer and a support layer stacked on the coating layer such that the support layer has surface on which a conductor layer is laminated and the coating layer is covering a conductor layer, each via conductor connecting two conductor layers through an insulating layer. The coating layer has a thickness greater than that of the support layer and includes inorganic filler at content rate of 65 to 85% by mass, and the support layer includes inorganic filler at different content rate such that thermal expansion coefficient of the coating layer is smaller than that of the support layer and the coefficients of the coating and support layers have difference of 30 ppm/° C. or less.

20 Claims, 11 Drawing Sheets

(56) References Cited

U.S. PATENT DOCUMENTS

| | | | | |
|---|---|---|---|---|
| 7,692,103 B2* | 4/2010 | Saiki | ................... | H05K 3/0035 |
| | | | | 174/262 |
| 8,318,599 B2* | 11/2012 | Nakagawa | ........ | H01L 21/76801 |
| | | | | 257/788 |
| 8,530,751 B2* | 9/2013 | Maeda | ................ | H01L 21/4857 |
| | | | | 174/258 |
| 8,802,996 B2* | 8/2014 | Hayashi | ............... | H05K 3/4673 |
| | | | | 174/255 |
| 9,060,455 B2* | 6/2015 | Kondo | ................... | H05K 3/387 |
| 9,091,921 B2* | 7/2015 | Yoshida | ................ | G03F 7/0047 |

\* cited by examiner

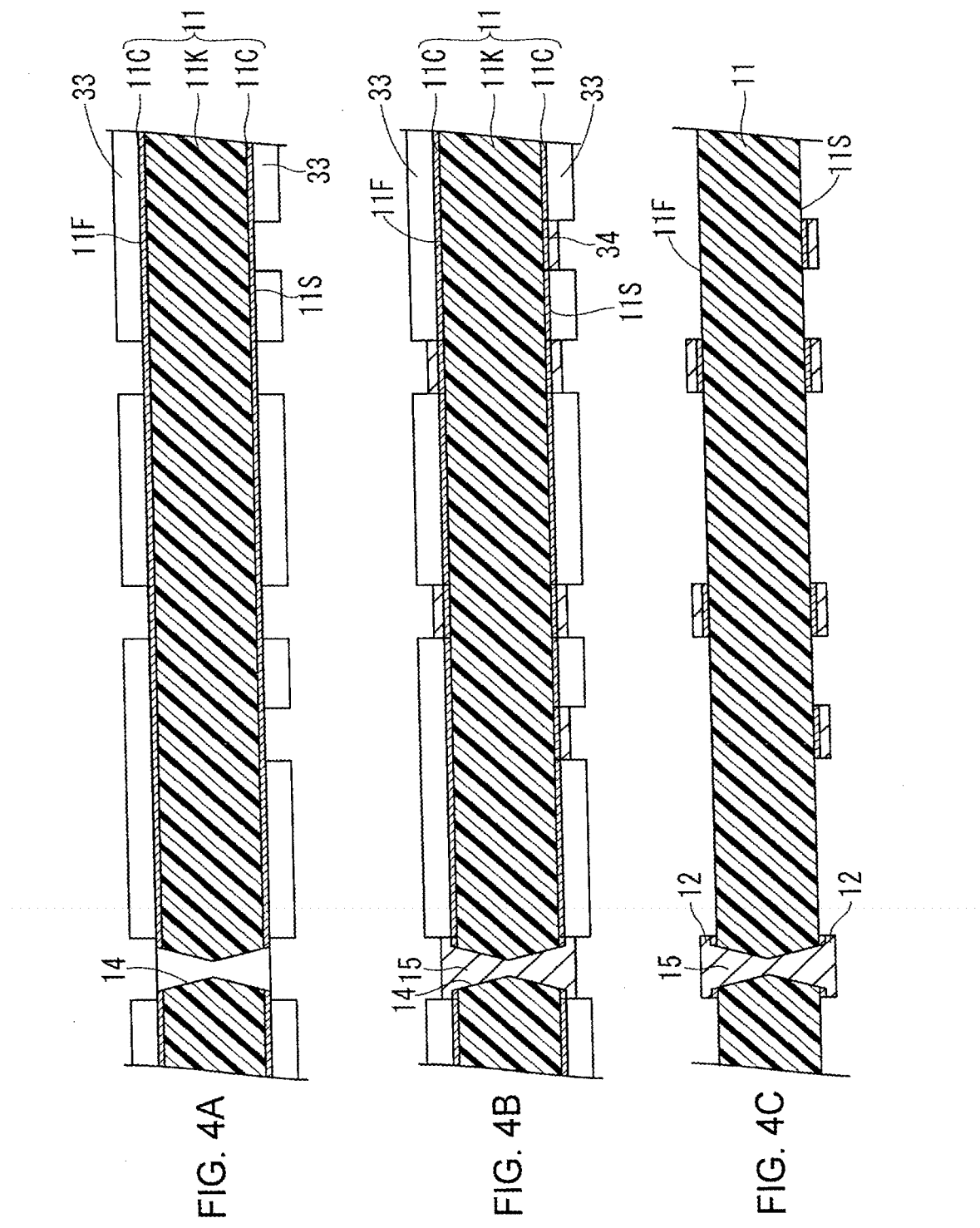

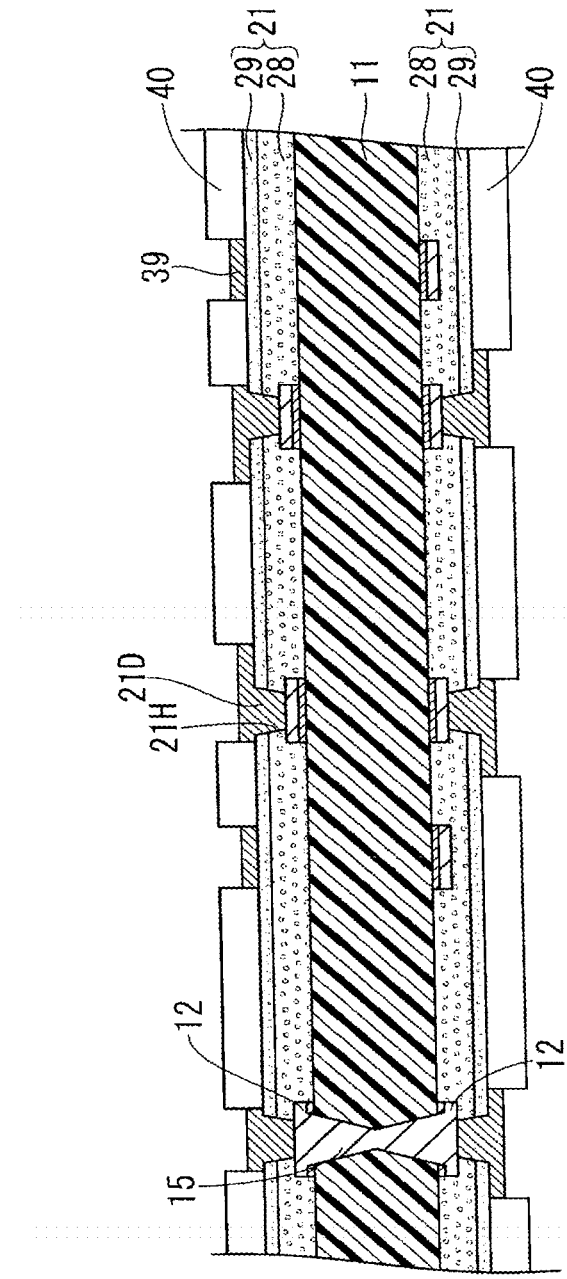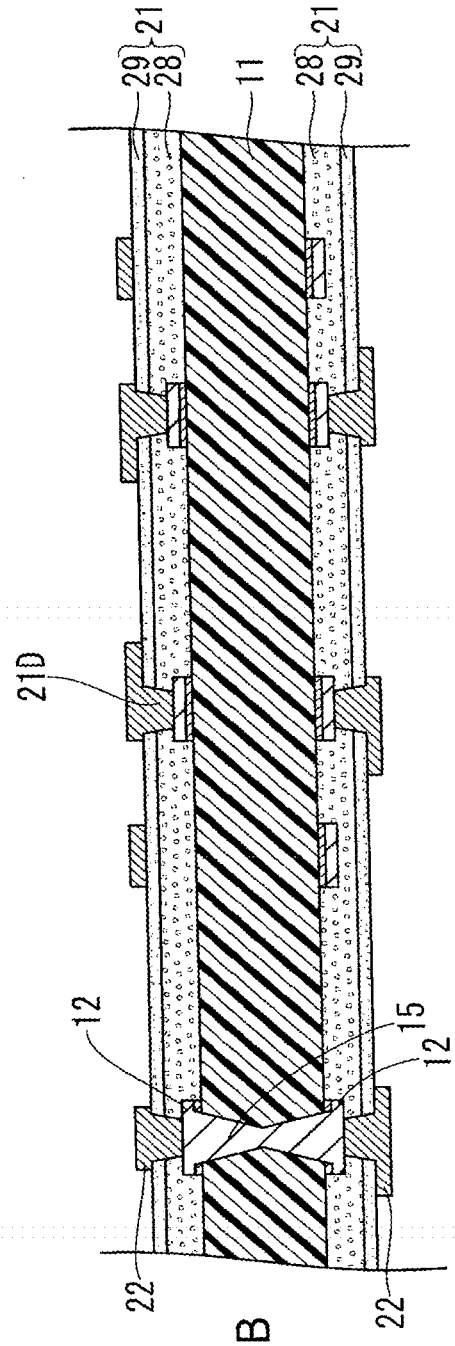
FIG. 6A
FIG. 6B

WIRING SUBSTRATE AND METHOD FOR MANUFACTURING THE SAME

CROSS-REFERENCE TO RELATED APPLICATIONS

The present application is based upon and claims the benefit of priority to Japanese Patent Application No. 2015-099629, filed May 15, 2015, the entire contents of which are incorporated herein by reference.

BACKGROUND OF THE INVENTION

Field of the Invention

The present invention relates to a wiring substrate in which conductor layers and insulating resin layers are alternately laminated on a core substrate, and relates to a method for manufacturing the wiring substrate.

Description of Background Art

A wiring substrate may have via conductors penetrating through the insulating resin layers to connect upper and lower conductor layers (for example, see Japanese Patent Laid-Open Publication No. 2001-345560). The entire contents of this publication are incorporated herein by reference.

SUMMARY OF THE INVENTION

According to one aspect of the present invention, a wiring substrate includes a core substrate, and a build-up layer formed on the core substrate and including conductor layers, insulating resin layers and via conductors such that the conductor layers and the insulating resin layers are alternately laminated on the core substrate and that the via conductors are formed in the insulating resin layers, each of the insulating resin layers being a two-layer insulating layer having a coating insulating layer and a support insulating layer stacked on a surface of the coating insulating layer such that the support insulating layer has a surface on which a respective one of the conductor layers is laminated and that the coating insulating layer is covering a respective one of the conductor layers on the opposite side of the support insulating layer, each of the via conductors being penetrating through the two-layer insulating layer and connecting two of the conductor layers through a respective one of the insulating resin layers. The coating insulating layer has a thickness which is greater than a thickness of the support insulating layer and includes inorganic filler at a content rate in a range of from 65% by mass to 85% by mass , and the support insulating layer includes inorganic filler at a content rate different from the content rate of the coating insulating layer such that a thermal expansion coefficient of the coating insulating layer is smaller than a thermal expansion coefficient of the support insulating layer and that the thermal expansion coefficients of the coating and support insulating layers have a difference of 30 ppm/° C. or less.

According to another aspect of the present invention, a method for manufacturing a wiring substrate includes forming on a core substrate a build-up layer including conductor layers, insulating resin layers and via conductors such that the conductor layers and the insulating resin layers are alternately laminated on the core substrate and that the via conductors are formed in the insulating resin layers, each of the insulating resin layers being a two-layer insulating layer having a coating insulating layer and a support insulating layer stacked on a surface of the coating insulating layer such that the support insulating layer has a surface on which a respective one of the conductor layers is laminated and that the coating insulating layer is covering a respective one of the conductor layers on the opposite side of the support insulating layer, each of the via conductors being penetrating through the two-layer insulating layer and connecting two of the conductor layers through a respective one of the insulating resin layers. The coating insulating layer has a thickness which is greater than a thickness of the support insulating layer and includes inorganic filler at a content rate in a range of from 65% by mass to 85% by mass , and the support insulating layer includes inorganic filler at a content rate different from the content rate of the coating insulating layer such that a thermal expansion coefficient of the coating insulating layer is smaller than a thermal expansion coefficient of the support insulating layer and that the thermal expansion coefficients of the coating and support insulating layers have a difference of 30 ppm/° C. or less.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4A-4C are cross-sectional side views illustrating manufacturing processes of the wiring substrate;

FIG. 6A and 6B are cross-sectional side views illustrating manufacturing processes of the wiring substrate;

DETAILED DESCRIPTION OF THE EMBODIMENTS

Figure 1:
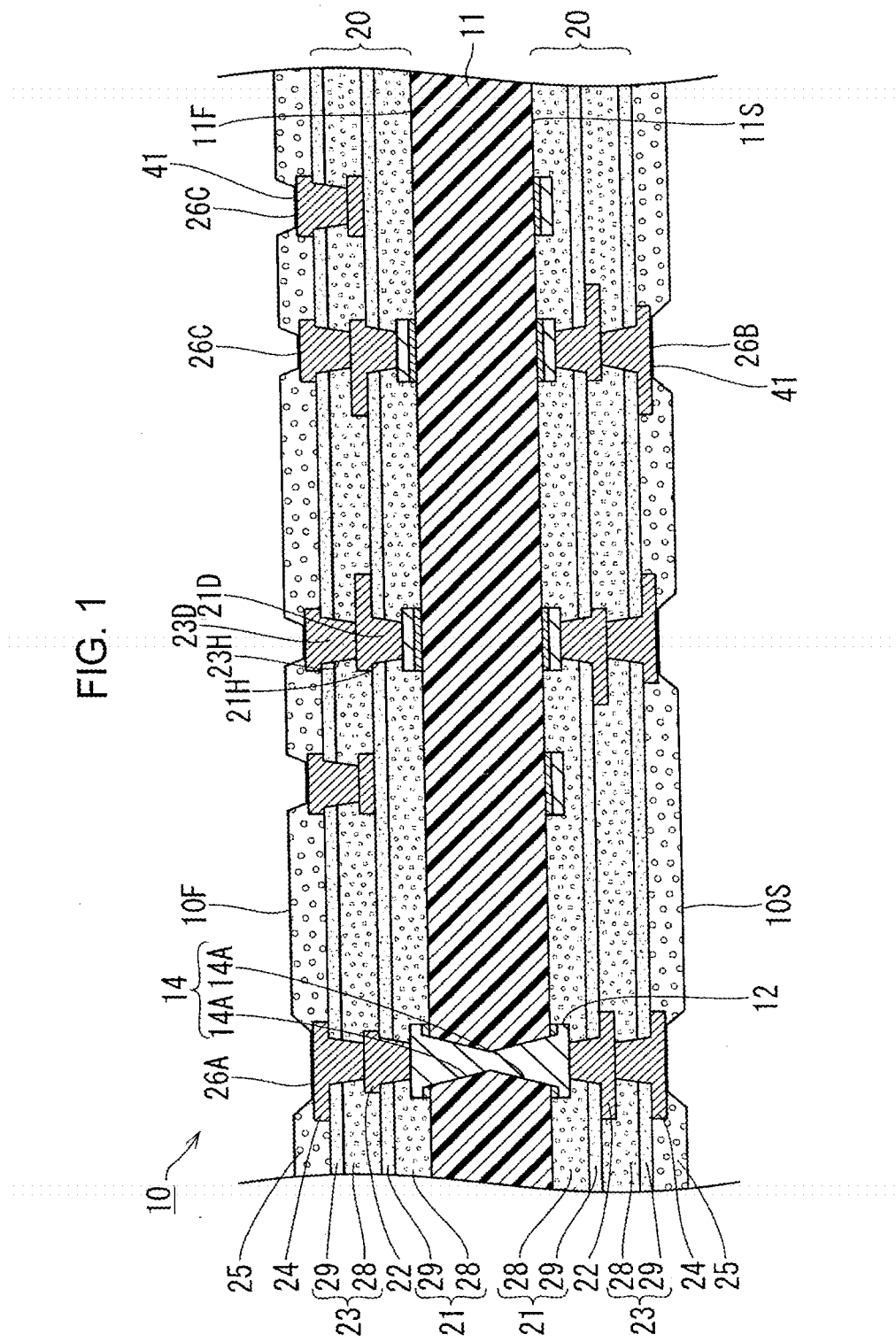
FIG. 1 is a cross-sectional side view of a wiring substrate according to a first embodiment of the present invention.
Figure 2:
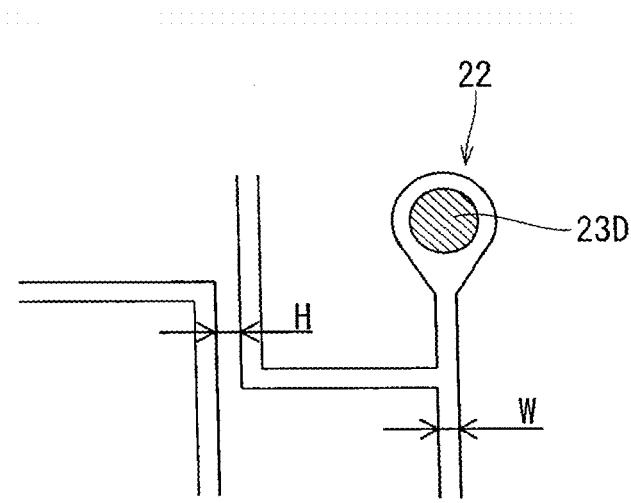
FIG. 2 is a plan cross-sectional view of the wiring substrate.

The embodiments will now be described with reference to the accompanying drawings, wherein like reference numerals designate corresponding or identical elements throughout the various drawings.

First Embodiment

In the following, a first embodiment of the present invention is described based on FIG. 1-9. As illustrated in FIG. 1, in a wiring substrate 10 of the present embodiment, build-up layers 20, 20 are respectively laminated on front and back surfaces of a core substrate 11. The core substrate 11 is formed of an insulating member. A conductor circuit layer 12 (corresponding to a "conductor layer" of the present invention) is formed on each of an F surface (11F), which is the front side surface of the core substrate 11, and an S surface (11S), which is the back side surface of the core substrate 11.

An electrical conduction through hole 14 is formed in the core substrate 11. The electrical conduction through hole 14 is formed in a middle-constricted shape in which small diameter side ends of tapered holes (14A, 14A) are communicatively connected, the tapered holes (14A, 14A) being respectively formed by drilling from the F surface (11F) and the S surface (11S) of the core substrate 11 and being gradually reduced in diameter toward a deep side. The electrical conduction through hole 14 is filled with plating and a through-hole electrical conductor 15 is formed. The conductor circuit layer 12 on the F surface (11F) and the conductor circuit layer 12 on the S surface (11 S) are connected by the through-hole electrical conductor 15.

Both the build-up layer 20 on the F surface (11F) side of the core substrate 11 and the build-up layer 20 on the S surface (11S) side are formed by sequentially laminating, the core substrate 11 side, a first insulating resin layer 21, a first conductor layer 22, a second insulating resin layer 23 and a second conductor layer 24. A solder resist layer 25 is laminated on the second conductor layer 24. The first insulating resin layer 21 and the second insulating resin layer 23 correspond to a "two-layer insulating layer" of the present invention.

Multiple pad holes are formed in the solder resist layer 25, and a portion of the second conductor layer 24 positioned in each of the pad holes becomes a pad. On an F surface (10F), which is a front side surface of the entire wiring substrate 10, multiple pads are formed including a group of medium pads (26A) and a group of small pads (26C). The group of the small pads (26C) is arrayed in a form of a matrix, and the group of the medium pads (26A) is arrayed in a form of a frame surrounding the group of the small pads (26C). On the other hand, pads on an S surface (10S), which is a back side surface of the entire wiring substrate 10, are formed as large pads (26B) that are larger than the medium pads (26A).

Multiple via holes (21H) and multiple via holes (23H) are respectively formed in the first insulating resin layer 21 and the second insulating resin layer 23. The via holes (21H, 23H) are all each formed in a tapered shape that is gradually reduced in diameter toward the core substrate 11 side. The via holes (21H, 23H) are filled with plating and multiple via conductors (21D, 23D) are formed. Then, the conductor circuit layer 12 and the first conductor layer 22 are connected by the via conductors (21D) of the first insulating resin layer 21; and the first conductor layer 22 and the second conductor layer 24 are connected by the via conductors (23D) of the second insulating resin layer 23. In the first and second conductor layers (22, 24), a minimum width (W) of a wiring pattern and a minimum distance (H) between wiring patterns both are 15 pm or less. Further, a diameter of a lower portion (so-called via bottom) of each of the via conductors (21D) connecting to the conductor circuit layer 12 and a diameter of a lower portion of each of the via conductors (23D) connecting to the first conductor layer 22 both are 50 pm or less.

As illustrated in FIG. 1, in the wiring substrate 10 of the present embodiment, the first insulating resin layer 21 and the second insulating resin layer 23 are each formed to have a two-layer structure that includes a support insulating layer 29 and a coating insulating layer 28 that is thicker than the support insulating layer 29. Specifically, the thickness of the support insulating layer 29 is 15-50% of the thickness of the coating insulating layer 28. In each of the first and second insulating resin layers (21, 23), the coating insulating layer 28 is formed on the core substrate 11 side, and the support insulating layer 29 is formed on an outer side. On an upper surface of each of the support insulating layers 29, the first conductor layer 22 or the second conductor layer 24 is formed. The upper surfaces of the support insulating layers 29 are roughened surfaces. Further, the coating insulating layer 28 of the first insulating resin layer 21 covers the conductor circuit layer 12 on the core substrate 11, and the coating insulating layer 28 of the second insulating resin layer 23 covers the first conductor layer 22 on the support insulating layer 29 of the first insulating resin layer 21.

The coating insulating layer 28 and the support insulating layer 29 both are formed from an insulating resin containing inorganic filler such as silica, alumina or mullite. In the insulating resin, the larger a content rate of the inorganic filler is, the smaller a thermal expansion coefficient is. In the present embodiment, the content rate of the inorganic filler of the support insulating layer 29 is 42 wt % and the thermal expansion coefficient of the support insulating layer 29 is 39 ppm/° C., whereas the content rate of the inorganic filler of the coating insulating layer 28 is 77 wt % and the thermal expansion coefficient of the coating insulating layer 28 is 12 ppm/° C. That is, the content rate of the inorganic filler of the support insulating layer 29 is such a content rate that the thermal expansion coefficient of the coating insulating layer 28 is smaller than the thermal expansion coefficient of the support insulating layer 29 and the difference is 30 ppm/° C. or less.

Further, a thermal expansion coefficient of a conductor is 16.8 ppm/° C. That is, the difference between the thermal expansion coefficient of the via conductors (21D, 23D) and the thermal expansion coefficient of the coating insulating layer 28 is 10 ppm/° C. or less, and the difference (16.8–12=4.8 ppm/° C.) between the thermal expansion coefficient of the via conductors (21D, 23D) and the conductor layers (22, 24) and the thermal expansion coefficient of the coating insulating layer 28 is ½ or less of the difference (39–16.8=22.2 ppm/° C.) between the thermal expansion coefficient of the via conductors (21D, 23D) and the conductor layers (22, 24) and the thermal expansion coefficient of the support insulating layer 29.

Further, an average particle size of the inorganic filler in the support insulating layer 29 is 0.5 μm and a dielectric loss tangent (tanδ) (which indicates an electrical energy loss in an insulator) of the support insulating layer 29 is 0.017. On the other hand, an average particle size of the inorganic filler in the coating insulating layer 28 is 1.0 μm and a dielectric loss tangent (tanδ) of the coating insulating layer 28 is 0.0093. The coating insulating layer 28 and the support insulating layer 29 both do not contain a glass cloth.

The wiring substrate 10 of the present embodiment is manufactured as follows.

Figure 3A:
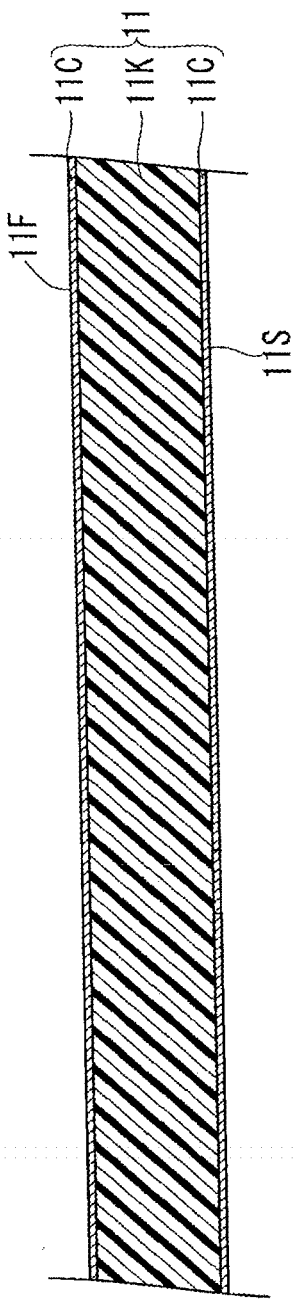
FIG. 3A-3C are cross-sectional side views illustrating manufacturing processes of the wiring substrate.

(1) As illustrated in FIG. 3A, a substrate as the core substrate 11 is prepared that is obtained by laminating a copper foil (11C) on both front and back surfaces of an insulating base material (11K) that is formed of an epoxy resin or a BT (bismaleimide triazine) resin and a reinforcing material such as a glass cloth.

Figure 3B:
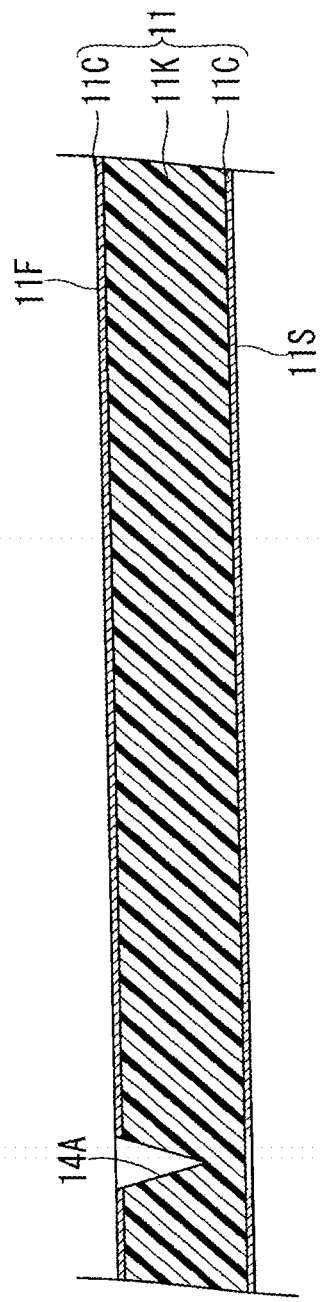

(2) As illustrated in FIG. 3B, a tapered hole (14A) for forming the electrical conduction through hole 14 (see FIG. 1) is drilled by irradiating, for example, CO2 laser to the core substrate 11 from the F surface (11F) side.

Figure 3C:
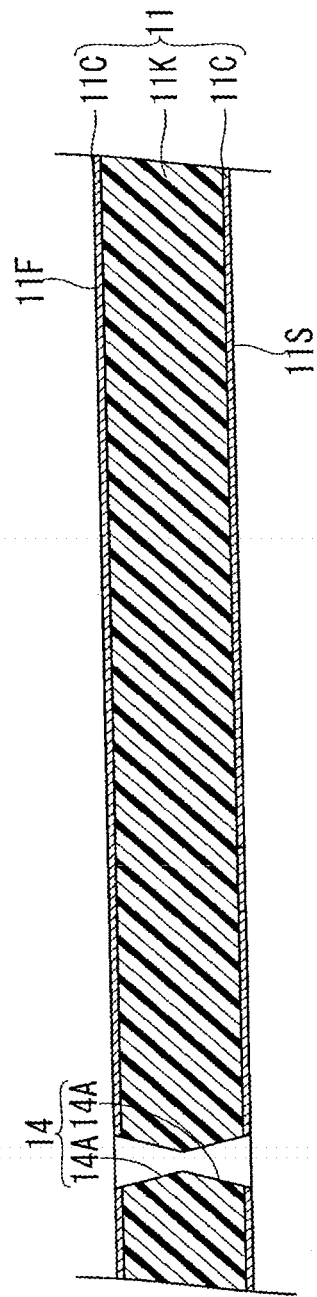

(3) As illustrated in FIG. 3C, a tapered hole (14A) is drilled on the S surface (11S) side of the core substrate 11 by irradiating CO2 laser to a position directly on the back of the above-described tapered hole (14A) on the F surface (11F)

side. The electrical conduction through hole 14 is formed from the tapered holes (14A, 14A).

(4) An electroless plating treatment is performed. An electroless plating film (not illustrated in the drawings) is formed on the copper foil (11C) and on an inner surface of the electrical conduction through hole 14.

(5) As illustrated in FIG. 4A, a plating resist 33 of a predetermined pattern is formed on the electroless plating film on the copper foil (11C).

(6) An electrolytic plating treatment is performed. As illustrated in FIG. 4B, the electrical conduction through hole 14 is filled with electrolytic plating and the through-hole electrical conductor 15 is formed; and an electrolytic plating film 34 is formed on a portion of the electroless plating film (not illustrated in the drawings) on the copper foil (11C), the portion being exposed from the plating resist 33.

(7) The plating resist 33 is peeled off, and the electroless plating film (not illustrated in the drawings) and the copper foil (11C), which are below the plating resist 33, are removed. As illustrated in FIG. 4C, by the remaining electrolytic plating film 34, electroless plating film and copper foil (11C), the conductor circuit layer 12 is formed on the F surface (11F) of the core substrate 11, and the conductor circuit layer 12 is formed on the S surface (11S) of the core substrate 11. Then, the conductor circuit layer 12 on the F surface (11F) and the conductor circuit layer 12 on the S surface (11S) are in a state of being connected by the through-hole electrical conductor 15.

Figures 5A, 5B, 5C:
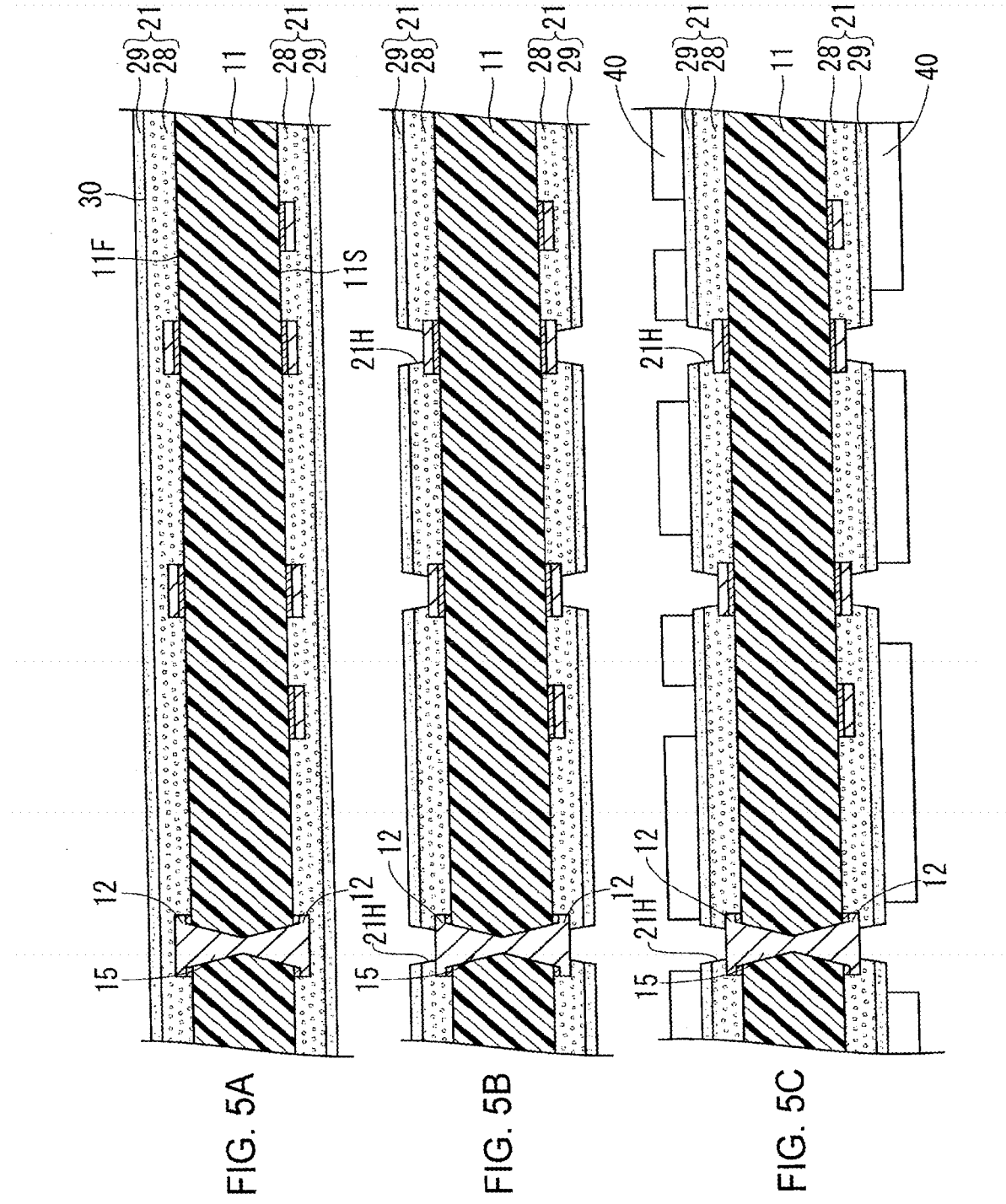
FIG. 5A-5C are cross-sectional side views illustrating manufacturing processes of the wiring substrate.

(8) As illustrated in FIG. 5A, on each of the conductor circuit layers (12, 12) on the front and back sides of the core substrate 11, as the first insulating resin layer 21, an insulating sheet 30 obtained by integrally forming the coating insulating layer 28 and the support insulating layer 29 is laminated with the coating insulating layer 28 side facing downward, and then the resulting substrate is hot-pressed. In this case, spaces between portions of each conductor circuit layer (12, 12) on the core substrate 11 are filled with the coating insulating layer 28.

(9) The upper surface of the support insulating layer 29 is roughened using a chemical solution.

(10) As illustrated in FIG. 5B, multiple via holes (12H) are formed by irradiating CO2 laser to the first insulating resin layers (21, 21) on the front and back sides of the core substrate 11. Some of the multiple via holes (21H) are formed on the conductor circuit layer 12.

(11) An electroless plating treatment is performed. An electroless plating film (not illustrated in the drawings) is formed on the first insulating resin layers (21, 21) and in the via holes (21H, 21H).

(12) As illustrated in FIG. 5C, a plating resist 40 of a predetermined pattern is formed on the electroless plating film.

(13) An electrolytic plating treatment is performed. As illustrated in FIG. 6A, the via holes (21H, 21H) are filled with plating and the via conductors (21D, 21D) are formed. Further, electrolytic plating films (39, 39) are formed on portions of the electroless plating film (not illustrated in the drawings) on the first insulating resin layers (21, 21), the portions being exposed from the plating resist 40.

(14) The plating resist 40 is removed, and the electroless plating film (not illustrated in the drawings) that is below the plating resist 4 is removed. As illustrated in FIG. 6B, the first conductor layers 22 are respectively formed on the first insulating resin layers 21 on the front and back sides of the core substrate 11 by the remaining electrolytic plating films 39 and electroless plating film. Then, a state is achieved in which, on each of the front and back sides of the core substrate 11, a portion of the first conductor layer 22 and the conductor circuit layer 12 are connected by the via conductors (21D).

Figure 7:
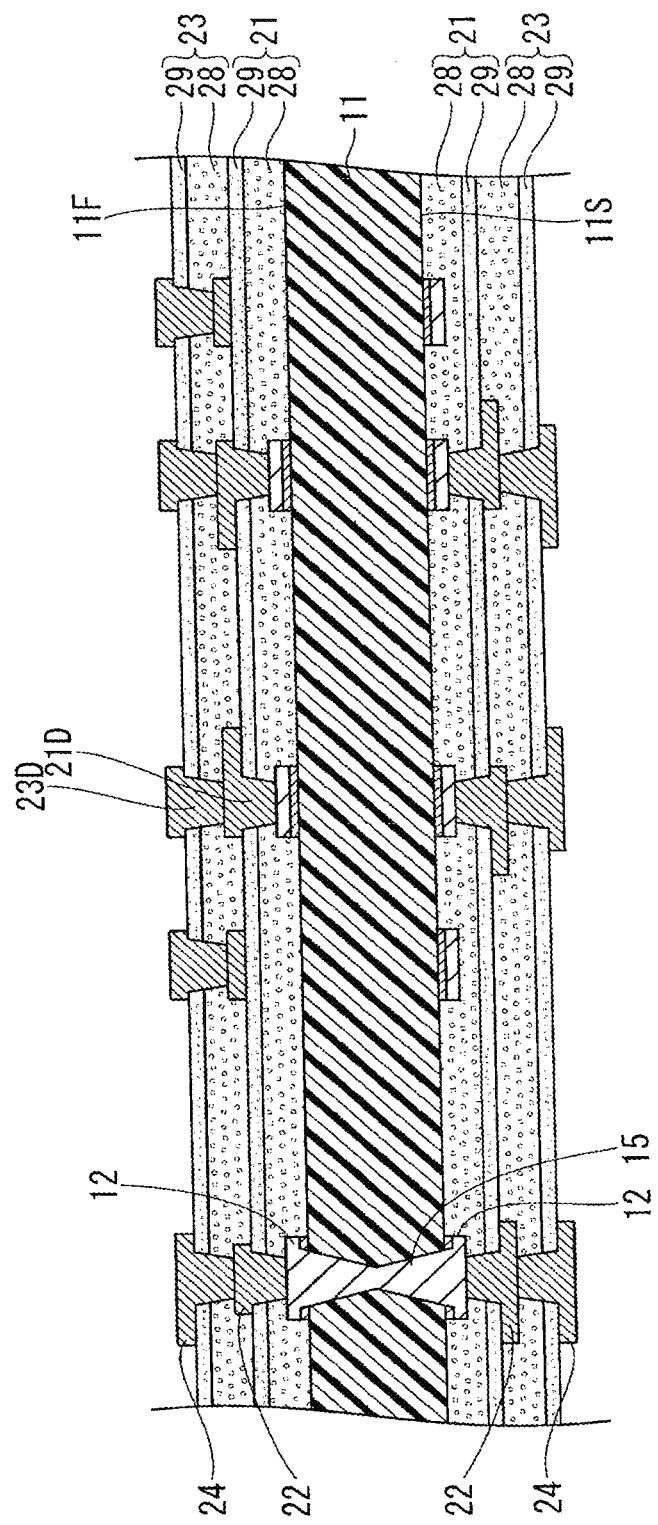
FIG. 7 is a cross-sectional side view illustrating a manufacturing process of the wiring substrate.

(15) By the same processing as described in the above (8)-(14), as illustrated in FIG. 7, a state is achieved in which, on each of the front and back sides of the core substrate 11, the second insulating resin layer 23 and the second conductor layer 24 are formed on the first conductor layer 22, and a portion of the second conductor layer 24 and the first conductor layer 22 are connected by the via conductors (23D).

Figure 8:
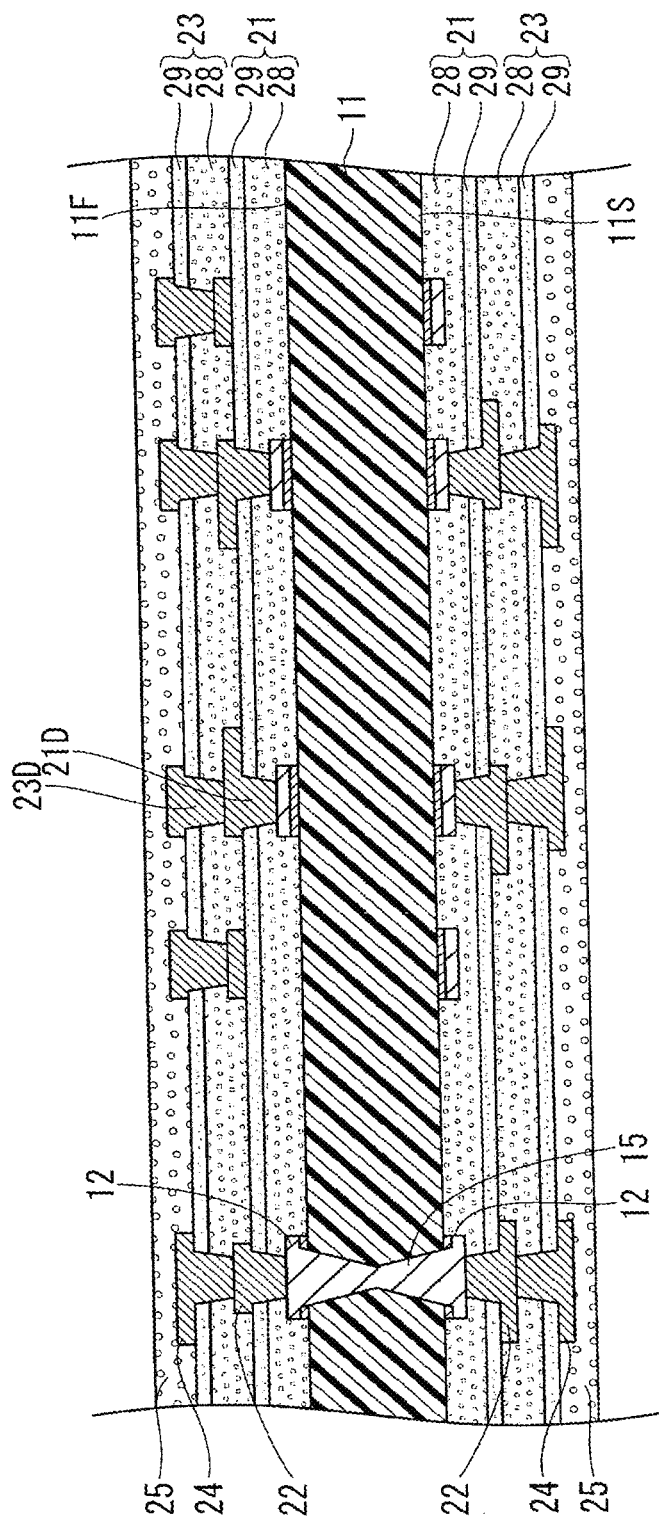
FIG. 8 is a cross-sectional side view illustrating a manufacturing process of the wiring substrate.

(16) As illustrated in FIG. 8, the solder resist layers (25, 25) are respectively laminated on the second conductor layers 24 on the front and back sides of the core substrate 11.

Figure 9:
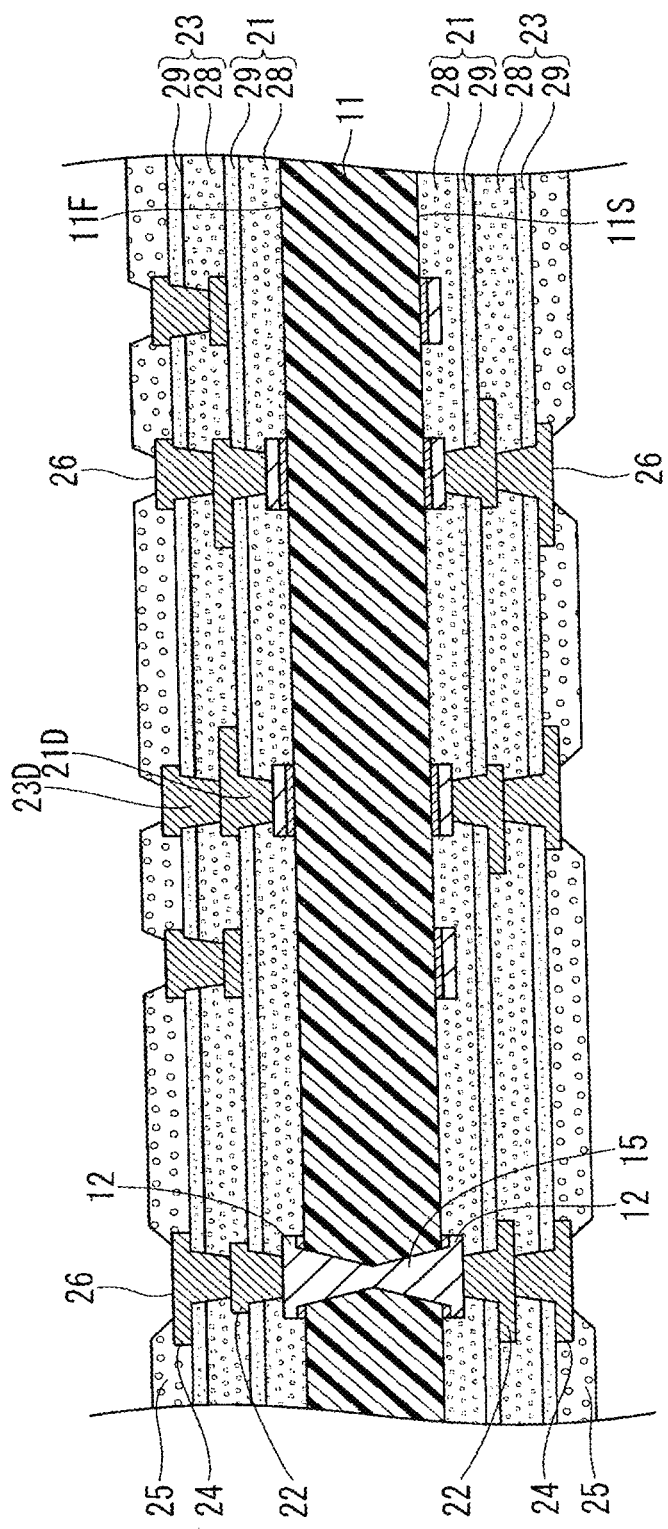
FIG. 9 is a cross-sectional side view illustrating a manufacturing process of the wiring substrate.

(17) As illustrated in FIG. 9, pad holes are formed at predetermined places on the solder resist layers (25, 25) on the front and back sides of the core substrate 11, and portions of the second conductor layers 24 on the front and back sides of the core substrate 11 that are exposed from the pad holes become the pads 26.

(18) On each of the pads 26, a nickel layer, a palladium layer and a gold layer are laminated in this order and a metal film 41 illustrated in FIG. 1 is formed. As a result, the wiring substrate 10 is completed. However, the metal film 41 is not limited to the above-described Ni/Pd/Au, but may also be Ni/Au or Sn. It is also possible that an OSP film is formed instead of the metal film 41.

The description about the structure and the manufacturing method of the wiring substrate 10 of the present embodiment is as given above. Next, an example of use and an operation effect of the wiring substrate 10 are described. The wiring substrate 10 of the present embodiment is used, for example, by forming solder bumps (not illustrated in the drawings) on the pads 26 on the F surface (10F) side and mounting and soldering a CPU or the like to the solder bumps, and soldering the pads 26 on the S surface (10S) side to pads of a motherboard. In this case, some of pads of the CPU and some of the pads of the motherboard are connected via the via conductors (21D, 23D) of the wiring substrate 10.

Here, for example, when the thermal expansion coefficient of the first insulating resin layer 21 is large (the difference between the thermal expansion coefficient of the first insulating resin layer 21 and the thermal expansion coefficient of the conductor is large), a problem can occur that a thermal stress acting on the via conductors (21D) (in particular, the via bottom portions having the smallest diameter) is increased and the via conductors (21D) are likely to peel off from the conductor circuit layer 12 below the via conductors (21D). In contrast, in the wiring substrate 10 of the present embodiment, the thermal expansion coefficient of the coating insulating layer 28 of the first insulating resin layer 21, that is, the portion that covers the upper surface of the conductor circuit layer 12 and the periphery of the via bottoms of the via conductors (21D) is small (the difference between the thermal expansion coefficient of the coating insulating layer 28 and the thermal expansion coefficient of the conductor is small). Therefore, that the via conductors (21D) are peeled off from the conductor circuit layer 12 under the influence of thermal expansion of the first insulating resin layer 21 can be prevented, and reliability of the connection between the via conductors (21D) and the conductor circuit layer 12 can be improved.

Similarly, reliability of the connection between the first conductor layer 22 and the via conductors (23D) can also be improved.

When the first and second insulating resin layers (21, 23) are each formed by only the coating insulating layer 28 having a small thermal expansion coefficient, the content rate of the inorganic filler in the entire first and second insulating resin layers (21, 23) becomes large. In this case, a large amount of the inorganic filler also exists on the surfaces of the first and second insulating resin layers (21, 23). However, it is difficult for the plating resist 40 to bond on the inorganic filler. Therefore, it is difficult to densely form the plating resist 40 on the first and second insulating resin layers (21, 23), and a dense (fine) wiring pattern cannot be formed.

In the wiring substrate 10 of the present embodiment, the first insulating resin layer 21 and the second insulating resin layer 23 are each formed to have the two-layer structure that includes the coating insulating layer 28 having a relatively small thermal expansion coefficient (the content rate of the inorganic filler is large) and the support insulating layer 29 having a relatively large thermal expansion coefficient (the content rate of the inorganic filler is small). Then, the conductor layers (22, 24) are each formed on the support insulating layer 29, of which the content rate of the inorganic filler is smaller, among the coating insulating layer 28 and the support insulating layer 29. Therefore, an anchor effect can be obtained during the formation of the plating resist 40, the plating resist 40 can be densely formed, and a dense (fine) wiring pattern can be formed. As a result, in the first and second conductor layers (22, 24), the minimum width (W) of a wiring pattern and the minimum distance (H) between wiring patterns can both be reduced to 15 µm or less.

Further, the average particle size of the inorganic filler in the support insulating layer 29 is smaller than the average particle size of the inorganic filler in the coating insulating layer 28. Therefore, adhesion of the plating resist 40 to the first and second insulating resin layers (21, 23) can be further improved. Further, the upper surface of the support insulating layer 29 is a roughened surface. Therefore, the anchor effect during the formation of the plating resist 40 is further strengthened, and it becomes easy for the plating resist 40 to be densely formed. Further, fixing strength of the conductor layers (22, 24) on the support insulating layers 29 is also increased.

Further, when the thermal expansion coefficient of the first and second insulating resin layers (21, 23) is large, due to expansion caused by heating and contraction caused by cooling, the entire wiring substrate 10 may warp. However, the first and second insulating resin layers (21, 23) each have the coating insulating layer 28 that has a relatively small thermal expansion coefficient. Thereby, the thermal expansion coefficient of the entire first and second insulating resin layers (21, 23) is reduced, and warpage of the entire wiring substrate 10 can be suppressed.

Further, in the wiring substrate 10 of the present embodiment, the upper surface and the side surface of the wiring pattern are covered by the coating insulating layer 28 that has a smaller dielectric loss tangent (tanδ) than the support insulating layer 29. Therefore, the electrical energy loss can be reduced as compared to a structure in which the wiring pattern is covered by the support insulating layer 29 only.

Other Embodiments (1) In the above embodiment, a magnitude of a thermal conductivity varies depending on a magnitude of the content rate of the inorganic filler. However, for example, it is also possible to adopt a structure in which the content rate of the inorganic filler is the same and the magnitude of the thermal conductivity is varied by varying the kind of the resin.

(2) In the above embodiment, the structure is adopted in which the insulating sheet 30 obtained by integrally forming the coating insulating layer 28 and the support insulating layer 29 is laminated. However, it is also possible to adopt a structure in which the coating insulating layer 28 and the support insulating layer 29 are separately laminated one by one.

(3) In the above embodiment, the content rate of the inorganic filler of the coating insulating layer 28 is 77 wt %, and the content rate of the inorganic filler of the support insulating layer 29 is 42 wt %. However, the present invention is not limited to this. It is preferable that the content rate of the inorganic filler of the coating insulating layer 28 be 65-85 wt %, and the content rate of the inorganic filler of the support insulating layer 29 be 30-50 wt %.

(4) In the above embodiment, two insulating resin layers are laminated on each of the front and back sides of the core substrate 11. However, it is also possible that one insulating resin layer is laminated on each of the front and back sides of the core substrate 20 11, or three or more insulating resin layers are laminated on each of the front and back sides of the core substrate 11.

(5) In the above embodiment, all of the first and second insulating resin layers (21, 23) are formed to have the two-layer structure that includes the coating insulating layer 28 and the support insulating layer 29. However, it is also possible to adopt a structure in which only one of the two insulating layers is formed to have the two-layer structure.

Figure 10:
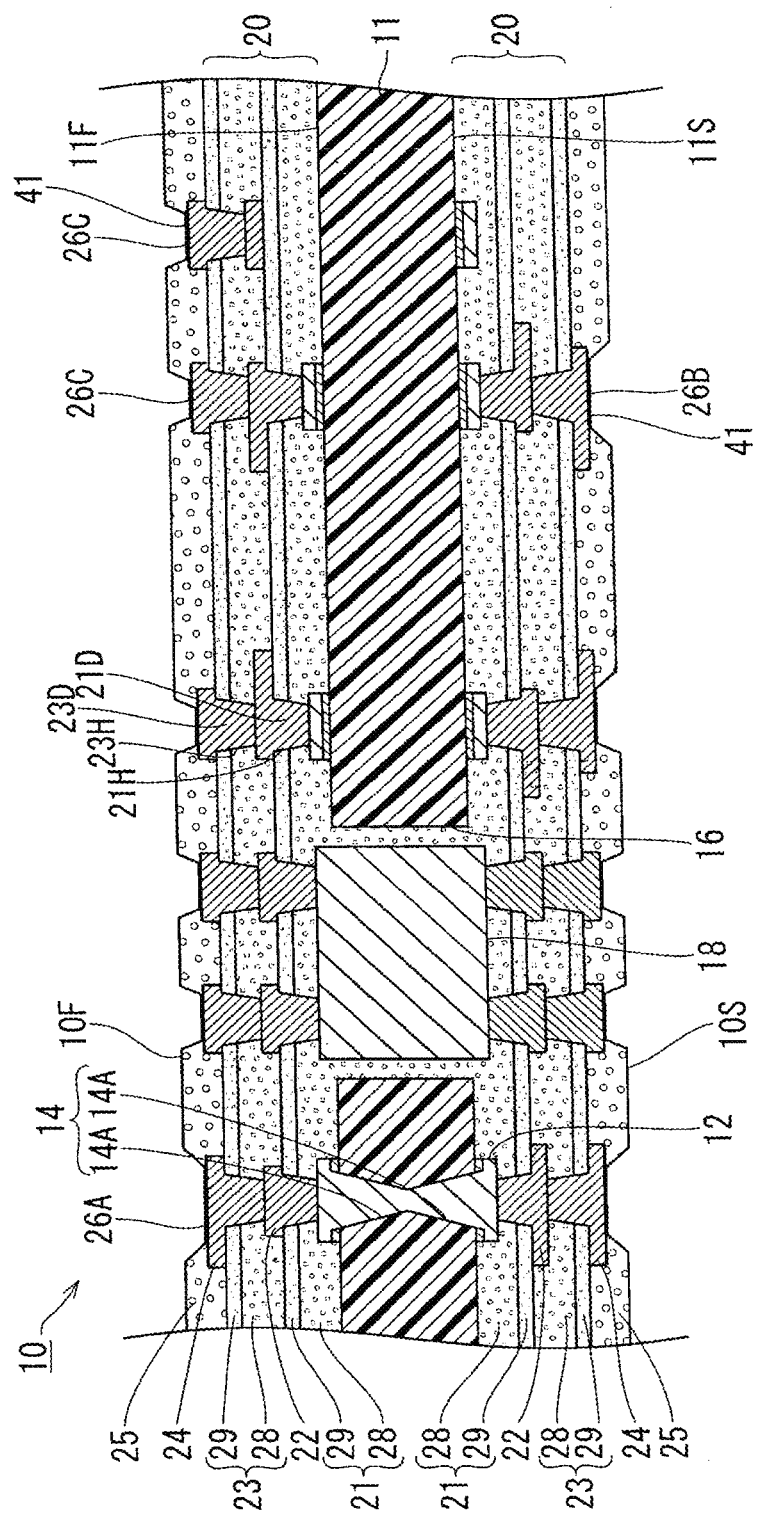
FIG. 10 is a cross-sectional side view of a wiring substrate according to a modified embodiment.
Figure 11:
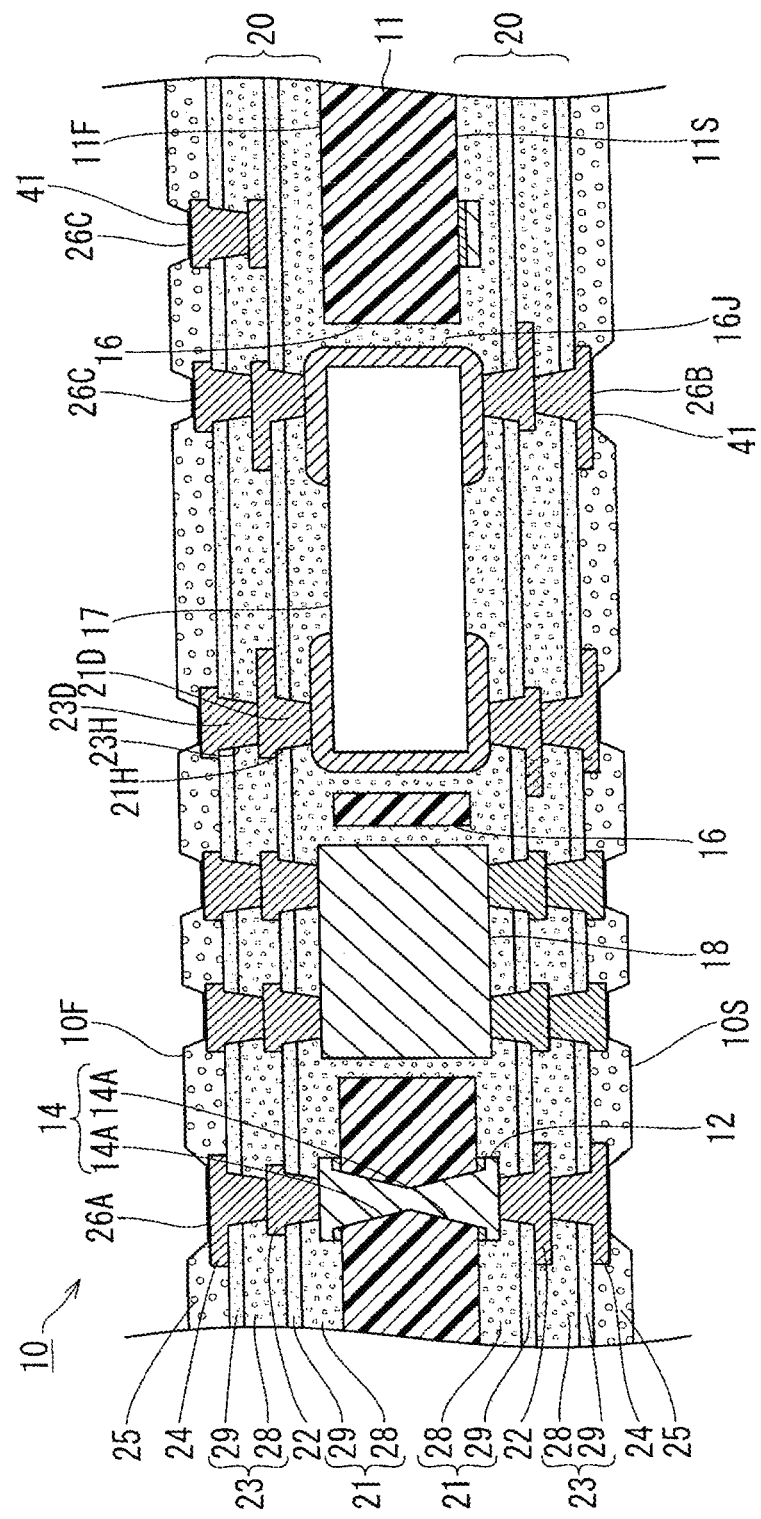
FIG. 11 is a cross-sectional side view of a wiring substrate according to a modified embodiment.

(6) In the above embodiment, no object is accommodated in the core substrate 11. However, as illustrated in FIG. 10, it is also possible to adopt a structure in which a cavity 16 is formed in the core substrate 11, and, for example, a metal block 17 is accommodated in the cavity 16. Further, as illustrated in FIG. 11, it is also possible to adopt a structure in which multiple cavities 16 are formed in the core substrate 11, and electronic components such as a multilayer ceramic capacitor 18 are accommodated together with the metal block 17 in the cavities 16.

In a wiring substrate, due to thermal deformation, via conductors may peel off from conductor layers.

A wiring substrate according to an embodiment of the present invention and a method for manufacturing a wiring substrate according to another embodiment of the present invention provide allow peeling of via conductors from a conductor layer to be suppressed and allow reliability of connection between the via conductors and the conductor layer to be improved.

According to one aspect of the present invention, a wiring substrate includes: a core substrate; conductor layers and insulating resin layers that are alternately laminated on the core substrate, each of the insulating resin layers being a two-layer insulating layer including a support insulating layer and a coating insulating layer, one of the conductor layers being laminated on an upper surface of the support insulating layer, the coating insulating layer being stacked below the support insulating layer and covering one of the conductor layers below the coating insulating layer, and no conductor layer being laminated on an upper surface of the coating insulating layer; and via conductors that penetrate the two-layer insulating layers and connect the upper and lower conductor layers. The coating insulating layer and the support insulating layer respectively contain inorganic fillers at different content rates such that a thermal expansion coefficient of the coating insulating layer is smaller than a thermal expansion coefficient of the support insulating layer and a difference between the thermal expansion coefficients is 30 ppm/° C. or less. The content rate of the inorganic filler of the coating insulating layer is 65-85% by mass. The coating insulating layer is thicker than the support insulating layer.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
   a core substrate; and
   a build-up layer formed on the core substrate and comprising a plurality of conductor layers, a plurality of insulating resin layers and a plurality of via conductors such that the conductor layers and the insulating resin layers are alternately laminated on the core substrate and that the via conductors are formed in the insulating resin layers, each of the insulating resin layers being a two-layer insulating layer comprising a coating insulating layer and a support insulating layer stacked on a surface of the coating insulating layer such that the support insulating layer has a surface on which a respective one of the conductor layers is laminated and that the coating insulating layer is covering a respective one of the conductor layers on an opposite side with respect to the support insulating layer, each of the via conductors being penetrating through the two-layer insulating layer and connecting two of the conductor layers through a respective one of the insulating resin layers,
   wherein the coating insulating layer has a thickness which is greater than a thickness of the support insulating layer and includes inorganic filler at a content rate in a range of from 65% by mass to 85% by mass , and the support insulating layer includes inorganic filler at a content rate different from the content rate of the coating insulating layer such that a thermal expansion coefficient of the coating insulating layer is smaller than a thermal expansion coefficient of the support insulating layer and that the thermal expansion coefficients of the coating and support insulating layers have a difference of 30 ppm/° C. or less.

2. A wiring substrate according to claim 1, wherein the inorganic filler of the coating insulating layer has an average particle diameter which is greater than an average particle diameter of the inorganic filler in the support insulating layer.

3. A wiring substrate according to claim 1, wherein the surface of the support insulating layer includes a roughened surface.

4. A wiring substrate according to claim 1, wherein the coating and support insulating layers are integrally formed such that the two-layer insulating layer of the coating and support insulating layers is forming a laminated film.

5. A wiring substrate according to claim 1, wherein the coating insulating layer has a dielectric loss tangent which is 0.01 or less and smaller than a dielectric loss tangent of the support insulating layer.

6. A wiring substrate according to claim 1, wherein each of the conductor layers formed on the support insulating layer has a wiring pattern formed such that the wiring pattern has a minimum width of 15 μm or less and a minimum distance of 15 μm or less between adjacent wirings of the wiring pattern.

7. A wiring substrate according to claim 1, wherein the coating insulating layer is formed such that a difference between the thermal expansion coefficient of the coating insulating layer and a thermal expansion coefficient of the via conductors is 10 ppm/° C. or less.

8. A wiring substrate according to claim 1, wherein each of the via conductors has a connection portion connected to a respective one of the conductor layers such that the connection portion has a diameter of 50 μm or less.

9. A wiring substrate according to claim 1, further comprising:
   a metal block accommodated in a cavity formed in the core substrate.

10. A wiring substrate according to claim 1, wherein the plurality of insulating resin layers is formed such that a difference between the thermal expansion coefficients of the coating insulating layer and the conductor layer and via conductors is set to be ½ or less than a difference between the thermal expansion coefficients of the support insulating layer and the conductor layer and via conductors.

11. A wiring substrate according to claim 1, wherein the plurality of via conductors is formed such that each of the via conductors is tapering toward the core substrate.

12. A wiring substrate according to claim 2, wherein the surface of the support insulating layer includes a roughened surface.

13. A wiring substrate according to claim 2, wherein the coating and support insulating layers are integrally formed such that the two-layer insulating layer of the coating and support insulating layers is forming a laminated film.

14. A wiring substrate according to claim 2, wherein the coating insulating layer has a dielectric loss tangent which is 0.01 or less and smaller than a dielectric loss tangent of the support insulating layer.

15. A wiring substrate according to claim 2, wherein each of the conductor layers formed on the support insulating layer has a wiring pattern formed such that the wiring pattern has a minimum width of 15 μm or less and a minimum distance of 15 μm or less between adjacent wirings of the wiring pattern.

16. A wiring substrate according to claim 2, wherein the coating insulating layer is formed such that a difference between the thermal expansion coefficient of the coating insulating layer and a thermal expansion coefficient of the via conductors is 10 ppm/° C. or less.

17. A wiring substrate according to claim 2, wherein each of the via conductors has a connection portion connected to a respective one of the conductor layers such that the connection portion has a diameter of 50 μm or less.

18. A wiring substrate according to claim 2, further comprising:
   a metal block accommodated in a cavity formed in the core substrate.

19. A method for manufacturing a wiring substrate, comprising:
   forming on a core substrate a build-up layer comprising a plurality of conductor layers, a plurality of insulating resin layers and a plurality of via conductors such that the conductor layers and the insulating resin layers are alternately laminated on the core substrate and that the via conductors are formed in the insulating resin layers, each of the insulating resin layers being a two-layer insulating layer comprising a coating insulating layer and a support insulating layer stacked on a surface of the coating insulating layer such that the support insulating layer has a surface on which a respective one of the conductor layers is laminated and that the coating insulating layer is covering a respective one of the conductor layers on an opposite side with respect to the support insulating layer, each of the via conductors being penetrating through the two-layer insulating layer and connecting two of the conductor layers through a respective one of the insulating resin layers, wherein the coating insulating layer has a thickness which is greater than a thickness of the support insulating layer and includes inorganic filler at a content rate in a range of from 65% by mass to 85% by mass, and the support insulating layer includes inorganic filler at a content rate different from the content rate of the coating insulating layer such that a thermal expansion coefficient of the coating insulating layer is smaller than a thermal expansion coefficient of the support insulating layer and that the thermal expansion coefficients of the coating and support insulating layers have a difference of 30 ppm/° C. or less.

20. A method for manufacturing a wiring substrate according to claim 19, wherein the forming of the build-up layer comprises integrally forming the coating and support insulating layers such that the two-layer insulating layer of the coating and support insulating layers forms a laminated film.

\* \* \* \* \*